United States Patent [19]

Johnson et al.

[11] Patent Number: 5,039,940
[45] Date of Patent: Aug. 13, 1991

[54] CONNECTOR FOR VERIFYING SEQUENCE OF TRANSIT CAR CONTROLS

[75] Inventors: Kevin D. Johnson, Liberty Boro; Lance C. Schnur, Eighty-Four; Robert P. Holuka, West Homestead; David L. Booher, Finleyville; Andrew E. Baron, II, Belle Vernon, all of Pa.

[73] Assignee: AEG Westinghouse Transportation Systems, Inc., Pittsburgh, Pa.

[21] Appl. No.: 513,670

[22] Filed: Apr. 24, 1990

[51] Int. Cl.[5] .................. G01R 31/00; G08B 19/00; G01M 15/00
[52] U.S. Cl. .................. 324/158 R; 324/73.1; 340/525; 73/116; 246/169 R
[58] Field of Search .......... 324/158 R, 73.1, 158 MG, 324/501; 322/99; 246/187 B, 182 R, 34 CT, 217, 218, 169 R, 3-5; 364/426.01, 426.05, 436; 340/459, 461, 525, 439; 73/116

[56] References Cited

U.S. PATENT DOCUMENTS

| | | | |
|---|---|---|---|
| 2,576,038 | 11/1951 | Pascoe et al. | 246/3 |
| 4,053,868 | 10/1977 | Cox et al. | 340/525 |
| 4,718,271 | 1/1988 | Garland | 246/169 R |
| 4,740,754 | 4/1988 | Finger | 324/427 |

Primary Examiner—Kenneth A. Wieder
Assistant Examiner—Vinh P. Nguyen
Attorney, Agent, or Firm—Spencer & Frank

[57] ABSTRACT

A sequence connector used during the testing of a control package attached to a transit car. The connector includes a display which indicates power modes in the control package which are requested by a master controller in the cab of the transit car. By comparing the power mode indicated by the connector with the functioning of the control package, the operation of the control package may be tested. The connector includes a lock-out device which prevents the transit car from being powered if the connector is inadvertently left attached to the control package.

15 Claims, 4 Drawing Sheets

CONNECTOR FOR VERIFYING SEQUENCE OF TRANSIT CAR CONTROLS

BACKGROUND OF THE INVENTION

The present invention relates to an apparatus used in verifying that the controls for a transit car, such as a subway car, are being sequenced properly by a master controller.

The master controller for a transit car allows a train operator to manually select the proper speed and direction of the car and to control the brakes and other functions. The master controller sends signals to a control package mounted under the car. Among the functions of the control package is to control the power to the car's motors for smooth acceleration and braking.

In the past, to test the operation of the control package, one device which has been employed is a portable sequence tester which simulates master controller signals for sequencing the control package through its various functions to insure proper operation. When using the portable sequence tester, a "shorting plug" with internal jumper wires is first removed from a relay panel contained in the control package. A control wiring harness for the portable sequence tester is then used to provide an interface between the tester and the control package, and all of the testing is done by the person operating the portable sequence tester under the car. During sequence testing, the portable sequence tester is set to a desired power state, simulating signals from the master controller to be sequentially transmitted to the control package. The operation of the control package is then observed.

Safety regulations now require that testing of the control package be carried out with an operator directly controlling the car's master controller from the cab of the transit car. These regulations effectively require two maintenance workers to carry out sequence testing of the control package: one person to operate the master controller in the cab of the car to issue master controller requests to the control package and a second person under the car to verify the proper operation of the control package.

The new testing procedures using two workers, as described above, is subject to error when using currently available testing equipment which requires connection of two temporary jumper wires into the control package to provide the proper control wiring paths needed to verify the proper operation of the control package from the cab request. This works satisfactorily until human error is introduced. For example, jumper wires are not always installed in the proper location or touch adjacent electrical termination points causing damage to a propulsion logic board for the control package.

SUMMARY OF THE INVENTION

Therefore, it is an object of the present invention to provide a sequence connector which reduces the complexity of testing procedures and prevents the possibility of improper wiring by avoiding the use of jumpers.

It is a further object of the invention to provide a sequence connector which, when connected to the control means of the transit car, prevents the transit car from accepting power if the connector is inadvertently left installed in the car.

It is another object of the invention to provide a sequence connector which indicates when the power mode circuits of the control means of a transit car are enabled and the type of power mode request issued by the car's master controller.

The above and other objects are accomplished according to the invention by the provision of a portable sequence connector for connection to a control means of an electrically powered transit car, the control means having a plurality of power mode circuits for controlling acceleration and deceleration of the transit car by way of externally supplied electrical power in response to power request signals to the control means from a master controller, the transit car having a battery supply connected for selectively enabling the power mode circuits when the transit car is not receiving externally supplied electrical power, including: a plurality of power mode lamps having terminals for connection to a respective one of the power mode circuits, each power mode lamp indicating when a power request signal is applied to a respective one of the power mode circuits; and lockout relay means for preventing the transit car from accepting externally supplied power when the connector is connected to the control means and for selectively enabling the power mode circuits.

The above and other objects are further accomplished according to one embodiment of the invention wherein there is provided a portable sequence connector for testing the power control system of an electrically powered transit car, wherein: the control system includes a control means for controlling power to the transit car by way of a main power circuit including power mode circuits and a brake circuit, the control means in turn being controlled by signals from a master controller, the car including propulsion logic means for monitoring and regulating the current in the control package and disabling the control means when there are open circuits in the main power circuit. The car also includes a battery supply for powering the operation of the control means when the car is not externally powered and a power/brake controller for enabling the power to the power mode circuits and the brake circuit in the control means. The novel sequence connector of the invention includes: connections for electrically connecting the connector to the control means, the battery supply for the control means and the propulsion logic means of the car; a current supplier, connected through the electrical connections to the battery supply, for producing a current and feeding such current to the propulsion logic means for simulating a closed main power circuit; a disabling device, including a normally open first interlock switch, for disabling the power/brake controller when the connector is connected to the control means and thereby disabling the power mode and brake circuits; a lock-out relay selectively connected to the battery supply for controlling the opening and closing of the first interlock switch, the lock-out relay closing the first interlock switch when the lock-out relay is energized by the battery supply; an activating switch connected in a first current path between the battery supply and the lock-out relay for selectively connecting the battery supply to the lock-out relay when the first interlock switch is closed; and display means for connection through the electrical connections to the power mode and brake circuit, for indicating the transmission of signals from the master controller to the control means when the first interlock switch is closed.

According to a further feature of the invention, the display means in the sequence connector includes individual lamps, preferably in the form of LEDs which allow a maintenance person under the transit car to "see" the control means operation that the operator in the cab has requested. According to a further feature of the invention, the lockout relay prevents the transit car to which the connector is attached from taking external power if the sequence connector is inadvertently left installed after completing a sequencing test.

DESCRIPTION OF THE PREFERRED EMBODIMENTS

In a subway train there are generally a number of cars, each generally having a cab at both ends. In normal operation, all of the cabs except for one cab at one end of the train are inoperative. However, when a car is serviced, it is disconnected from the train and one of the cabs on the car may used to perform tests on the car. Tests may be performed from the cab by a master controller located in the cab. The master controller has a handle which may be turned to a number of different positions which control the power to the car.

Figure 1:
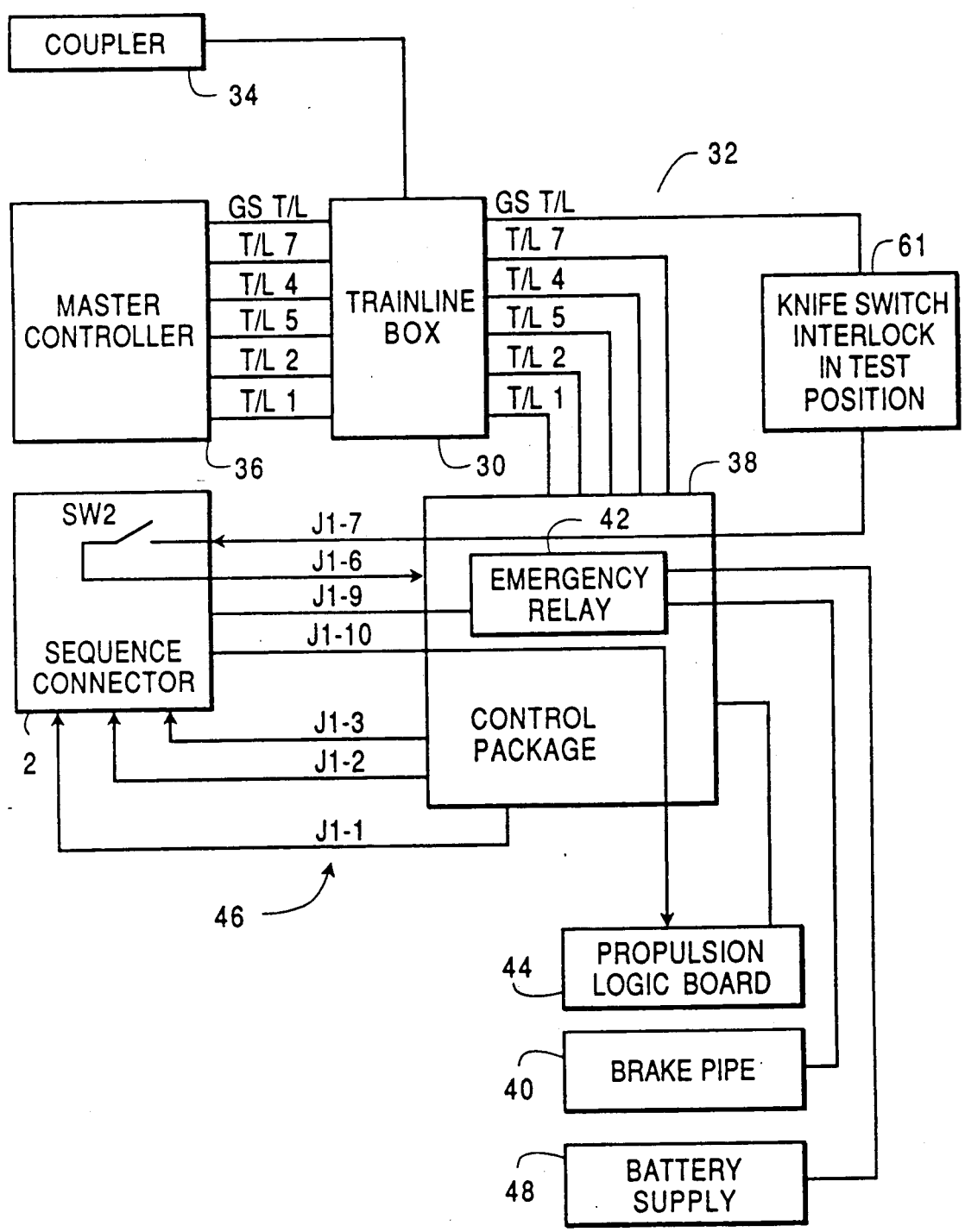
FIG. 1 is a block diagram which illustrates the operation of the invention.

FIG. 1 is a simplified block diagram showing a sequence connector according to the invention connected to a control package of a commercially available transit car. All of the blocks, with the exception of sequence connector 2, are known prior art devices in existence in transit cars currently in use. As shown in FIG. 1, associated with each car is a trainline box 30 through which a number of trainlines 32 controlling power to the car pass. Trainlines 32 extend throughout the train and are connected to each other by a coupler 34 in each car when the cars are coupled together. For each car the trainlines also extend from at least one master controller 36, through trainline box 30, to a control package 38 for the car.

Figure 2:
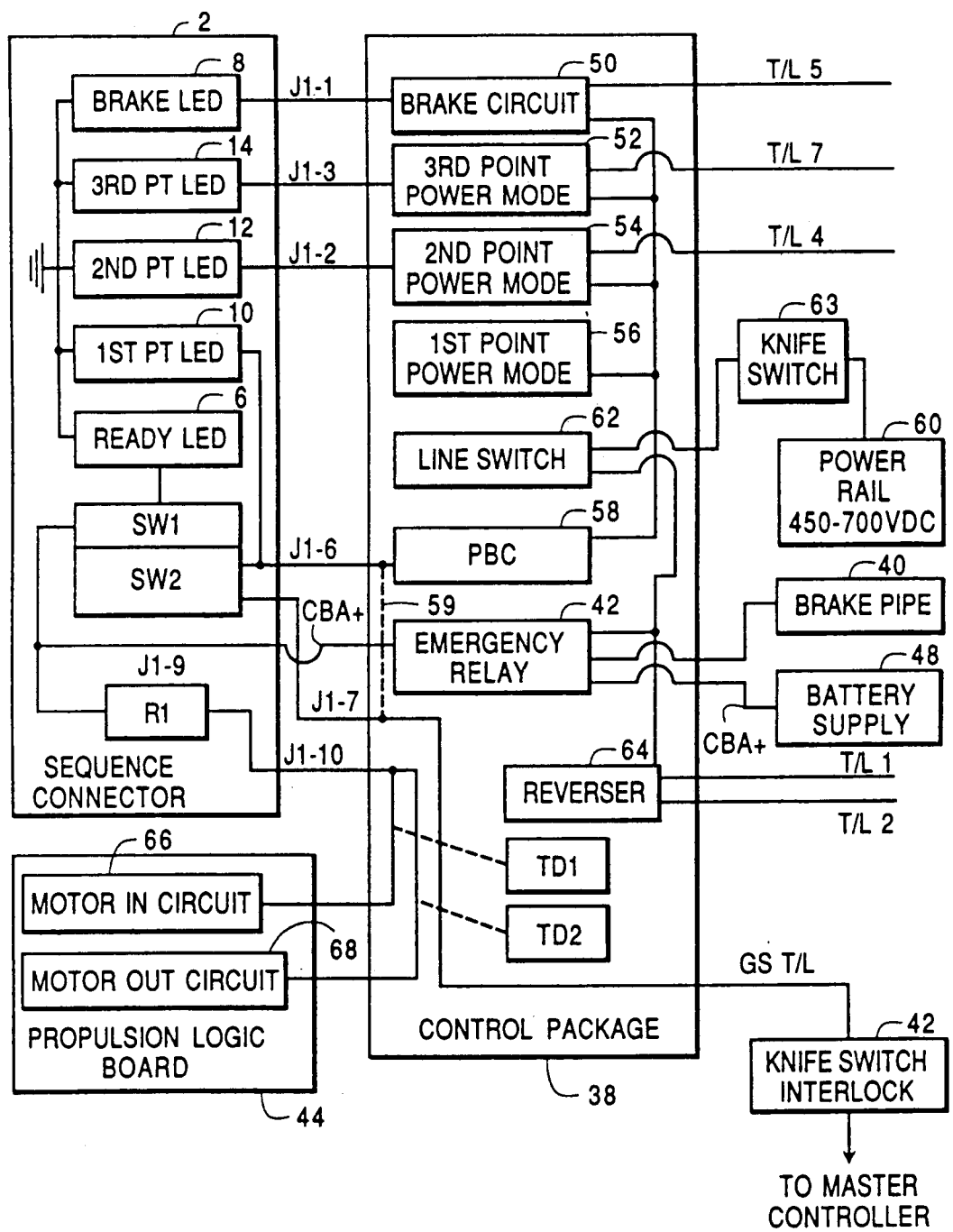
FIG. 2 is a block diagram which further illustrates the operation of a sequence connector according to the invention.

FIG. 2 illustrates the functioning of control package 38 and sequence connector 2 in greater detail. Some features of sequence connector 2 and control package 38 have been simplified for the sake of clarity. A power request trainline GS T/L is normally connected to a power/brake controller (PBC) circuit 58, which is a two position circuit in control package 38, this connection being represented by dashed line 59. When sequence connector 2 is connected as shown in FIG. 2, power request trainline GS T/L is connected to PBC circuit 58 by way of a switch SW2 in sequence connector 2 and knife switch interlock 61 as will be explained below. The main knife switch blade must be open to allow closure of the low voltage interlock. When PBC circuit 58 is in an energized position, i.e. is given a signal from master controller 36 by GS T/L, PBC circuit 58 allows the transit car to take power. When PBC circuit 58 is in a de-energized position, it performs a brake function.

When trainline T/L 1 in FIGS. 1 and 2, is selected by master controller 36 and energized, control package 38 and, therefore, the car are given a signal to move forward. When trainline T/L 2, is selected, the car is put into reverse. In normal operation only one of T/L 1 and T/L 2 is energized at a time. As shown in FIG. 2, the trainlines T/L 1 and T/L 2 are connected to control package 38 at a reverser 64.

When a particular power mode is requested by master controller 36, various resistors in the power mode circuits 52, 54 and 56 are switched, resulting in an acceleration of the car. If master controller 36 sends a signal on trainline T/L 7, resistors in 1st, 2nd and 3rd point circuits 52, 54 and 56 are open or closed to accelerate the car to its third power mode. Further, if a signal is sent from master controller 36 on trainline T/L 5, resistors in brake circuit 50 are opened or closed to brake the car. A 2nd point circuit 54 and a 1st point circuit 56 are operated in a similar fashion to accelerate or decelerate the car. The power mode circuits 52, 54 and 56 together with brake circuit 50 form a main power circuit for the transit car.

In normal operation, control package 38 is electrically connected at a line switch 62 to power rail 60 via a high voltage knife switch 63 which supplies power to the transit car. A typical voltage for power rail 60 is between about 450 to 780V D.C.

A propulsion logic board 44, which is typically mounted underneath the car near control package 38, monitors the functioning of control package 38 and regulates current to control package 38 by a cam controller (not shown) in control package 38. The car controller has the function of causing various resistors in control package 38 to be opened or closed as required. Propulsion logic board 44 includes a Motor In Circuit 66 and Motor Out Circuit 68 which in normal operation are connected to an input current transducer TD1 and an output current transducer TD2, as shown by dashed lines. Motor In Circuit 66 by means of input transducer TD1 measures the input of current from power rail 60 into control package 38 while Motor Out Circuit 68, by means output transducer TD2, measures current in control package 38 after the current has passed through power mode circuits 52, 54, or 56. If Motor In Circuit 66 and Motor Out Circuit 68 measure substantially unequal currents, propulsion logic board 44 detects a ground fault in power mode circuits 52, 54, 56 and disables control package 38 by means not shown.

Figure 3:
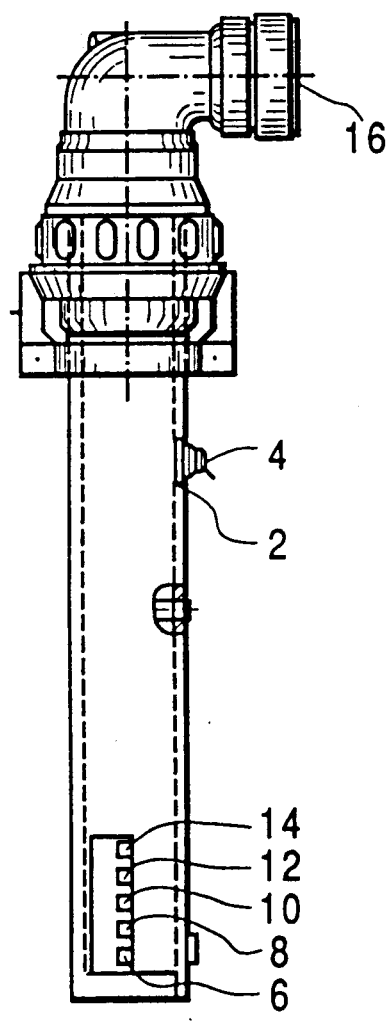
FIG. 3 is a side view of one embodiment of the invention.
Figure 4:
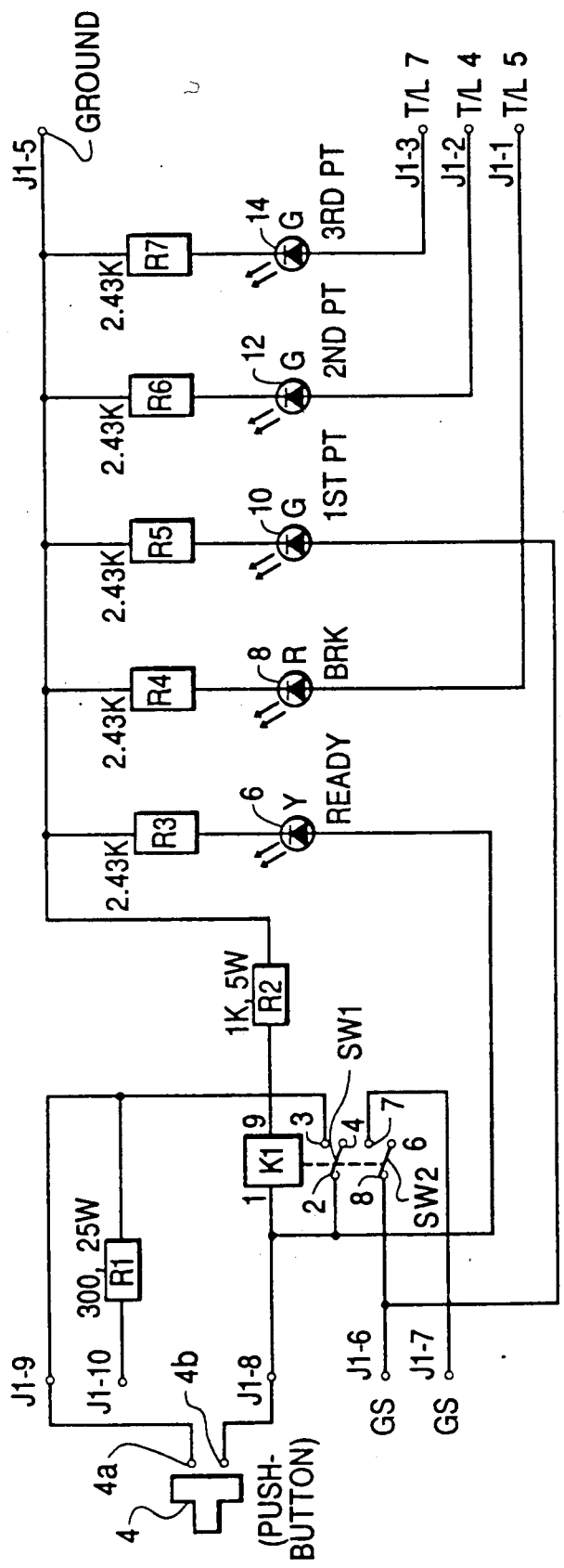
FIG. 4 is an electrical schematic for the embodiment of a sequence connector according to the invention shown in FIG. 3.

FIG. 3 shows a sequence connector according to the invention and FIG. 4 is an electrical schematic of the sequence connector. In this embodiment sequence connector 2 has five indicator lamps which are preferably LEDs: a ready LED 6, a brake LED 8, a 1st point LED 10, a 2nd point LED 12 and a 3rd point LED 14. These LEDs indicate which particular power mode is being tested at a given time in control package 38 to which sequence connector 2 is attached. Sequence connector 2 is connected to control package 38 by a pin connector 16 which plugs into a control panel (not shown) of control package 38. Before plugging sequence connector 2 into the control panel, a shorting plug is removed which has the effect of breaking trainline GS T/L within control package 38 (see dashed line 59 on FIG. 2 which illustrates a non-broken trainline GS T/L) so that trainline GS T/L has two free ends. In addition, removing the shorting plug breaks the connection, shown by dashed lines, between transducer TD1 and TD2 with Motor In Circuit 66 and Motor Out Circuit 68, respectively. Sequence connector pins J1-6 and J1-7 are then connected with the two free ends of trainline GS T/L when sequence connector 2 is plugged into the control panel. Trainline GS T/L remains open, however, because an interlock switch SW2 in sequence connector 2 is at position 8-6, an open position (See FIG. 4). Therefore, when sequence connector 2 is connected to control package 38, the car is prevented from taking power from electrified power rail 60. As shown in FIG. 2 and 4, when a power mode is requested by master controller 36 by appropriate selection of one of trainlines 32, current flows from control package 38 through the appropriate LED or LEDs and completes a circuit to ground located at terminal J1-5 in FIG. 4.

Because the car is not powered by power rail 60 during testing, control package 38 must be powered with current from a battery supply 48 via an electrical connection CBA+. To test control package 38, sequence connector 2 is connected to control package 38 by way of pins 46 (FIG. 1) of pin connector 16 (FIG. 3), and a brake pipe 40 on the car is charged with air to energize battery supply 48 by way of an emergency relay 42 thereby providing power to control package 38. A current is then allowed to flow from battery supply 48 to terminal J1-9 of sequence connector 2 to lock-out relay K1, by pressing a push-button 4 which connects terminals 4a and 4b. When brake pipe 40 is charged, current also flows across a resistor R1, and into Motor In Circuit 66 and Motor Out Circuit 68, thereby providing a simulated power circuit so that propulsion logic board 44 is unable to detect that the car is not being powered by power rail 60.

After installing sequence connector 2 on control package 38, charging brake pipe 40 on the transit car, and turning the handle on master controller 36 to an off position, control package 38 may be tested by pressing push-button 4. If ready LED 6 is illuminated, indicating a completed trainline GS T/L circuit by way of sequence connector 2, control package 38 may be sequenced. If push-button 4 is not depressed, the LEDs 8, 10, 12, and 14 in sequence connector 2 will be illuminated in response to commands from master controller 36, but ready LED 6 will not be illuminated and control package 38 will not respond due to a lock-out relay K1 in sequence connector 2 for reasons described in greater detail below.

With sequence connector 2 properly connected to control package 38, if trainline T/L 5 from master controller 36 is energized and push-button 4 is depressed, ready LED 6 and brake LED 8 will be illuminated. When a switch on master controller 36 is turned to a 1st position which activates trainline GS T/L (thereby deactivating trainline T/L 5), 1st point circuit 56 will be activated, 1st point LED 10 will turn on and brake LED 8 will turn off. When the switch on master controller 36 is turned to a 2nd position which activates trainline GS T/L and trainline T/L 4, 2nd point circuit 54 will be activated and 2nd point LED 12 will turn on. When the switch on master controller 36 is moved to a 3rd position which activates trainline GS T/L, trainline T/L 4 and trainline T/L 7, 3rd point circuit 52 is activated and 3rd point LED 14 will turn on. When the switch on master controller is turned to an "off" position and a brake controller in the cab is switched to "Brake", trainline T/L 5 is activated, brake circuit 50 will be activated and brake LED 8 will turn on.

The various LEDs may be the same or different colors. For example, in the embodiment shown in FIG. 3 ready LED 6 is a yellow light, brake LED 8 is a red light, and 1st point LED 10, 2nd point LED 12 and 3rd point LED 14 are green lights. The LEDs allow a maintenance worker under a transit car to monitor which trainlines are being requested by the operator who operates master controller 36 in the cab, because each of the lights correspond to a designated power mode circuit being operated. By comparing the power mode circuit requested, as indicated by the corresponding LED, with the operation of that power mode circuit in the control package, the maintenance person may verify that the control trainlines are working properly.

In a preferred embodiment, sequence connector 2 operates as a lock-out, preventing the car from taking power from the power rail, as will be apparent from the following description.

When a transit car is disconnected from a train, brake pipe 40 of the car is charged, causing emergency relay 42 to become energized. Energizing emergency relay 42 causes the emergency brake on the car to be released, but not the service brakes. Once the emergency relay is energized, an interlock on emergency relay 42 is closed in control package 38 which allows current from battery supply 48 via electrical connection CBA+ into control package 38. When the car is tested, energized emergency relay 42 allows current from battery supply 48 to energize 12V lock-out relay K1 of sequence connector 2, when push-button 4 is depressed. If push-button 4 is not depressed, relay K1 will not be energized and control package 38 cannot be operated. Energization of relay K1 is monitored by the person using sequence connector 2 by observing ready LED 6 on sequence connector 2.

Once relay K1 is energized, it moves interlock switch SW1, preferably by a "finger", from its open position 2-4 to its closed position 2-3, thereby allowing battery voltage from battery supply 48 via electrical connection CBA+ (connected to sequence connector 2 at terminal J1-9) to complete a circuit in sequence connector 2 and turn ready LED 6 on. Current from K1 flows to ground at terminal J1-5 through resistor R2. A circuit is completed through relay K1 after push-button 4 is released by way of closed switch SW1. Switch SW2 is mechanically linked to switch SW1 and moves from its open position 8-6 to its closed position 8-7 when switch SW1 is closed. When switch SW2 is closed, the circuit of trainline GS T/L is completed so that PBC circuit 58 in control package 38 is energized and control package 38 can take power from battery supply 48. Therefore, by completing trainline GS T/L, pressing push-button 4 allows a person operating master controller 36 to operate control package 38 without the car being given power from power rail 60.

When the user releases push-button 4, relay K1 remains energized because when switch SW1 is closed a completed circuit including relay K1 is formed from CBA+ to ground at J1-5.

When brake pipe 40 is dumped after testing, emergency relay 42 is de-energized, thereby activating the emergency brake. When the emergency brake is activated, the car is immobilized and is ready to be coupled to another car. When the car is immobilized, sequence connector 2 functions as a lock-out device to prevent the car from taking power while sequence connector 2 is installed. Sequence connector 2 functions as a lock-out device, because dumping brake pipe 40 causes the voltage from battery supply 48 to go to zero inside control package 38, thereby de-energizing relay K1 and opening switches SW1 and SW2. When switch SW2 is open, trainline GS T/L is cut and the car cannot take power as previously mentioned. The above described "lock-out" device feature of the invention prevents sequence connector 2 from being left installed on the car. An advantage of this lock-out device is that when sequence connector 2 (or a set of jumper wires in prior devices) is attached to control package 38, the presence of an open brake circuit or open power circuit is not detectable. In such a situation, if power were taken by the car and resistors in a brake circuit or power circuit in control package 38 were open, the resistors and/or main traction motors in the power and brake circuits would be damaged. Instead, because sequence connector 2 functions as a lock-out device, the user is forced to remove sequence connector 2, prior to the car taking power, so any open resistors in the circuits may be detected by propulsion logic board 44.

Sequence connector 2 is designed to be easily handled in one hand and is small enough to be placed in a car inspector's tool box or work belt. Desirably, however, sequence connector 2 is preferably long enough to become an obstruction to the closing of the control package doors while sequence connector 2 is installed. For this reason, pin connector 16 is preferably strong enough to withstand the impact of a spring loaded door of the control package. Sequence connector 2 has a housing comprised preferably of a tube of Lexan (a polycarbonate resin manufactured by General Electric) which has good strength. Preferably, inside the Lexan tube there is an aluminum sleeve which aids in heat dissipation.

It will be understood that the above description of the present invention is susceptible to various modifications, changes and adaptations, and the same are intended to be comprehended within the meaning and range of equivalents of the appended claims.

What is claimed is:

1. A portable sequence connector for testing the power control system of an electrically powered transit car, the control system including control means with a main power circuit for controlling power to the transit car by way of the main power circuit which includes power mode circuits and a brake circuit, the control means in turn being controlled by signals from a master controller and including a power/brake controller for enabling the power to the power mode circuits and the brake circuit, the car including propulsion logic means for monitoring and regulating current in the control means and disabling the control means when there are open circuits in the main power circuit, and a battery supply for powering the operation of the control means when the car is not externally powered, said connector comprising:

connecting means for electrically connecting said connector to the control means, the battery supply and the propulsion logic means of the car, current means, connected through said connecting means to the battery supply, for producing a current and feeding such current to the propulsion logic means for simulating a closed main power circuit;

disabling means, including a normally open first interlock switch, for disabling the power/brake controller when said connector is connected to the control means and thereby disabling the power mode and brake circuits;

lock-out relay means selectively connected to the battery supply for controlling the opening and closing of said first interlock switch, said lock-out relay means closing said first interlock switch when said lock-out relay means is energized by the battery supply;

an activating switch connected in a first current path between the battery supply and said lock-out relay means for selectively connecting the battery supply to said lock-out relay means and for closing said first interlock switch; and display means for connection through said connecting means to the power mode and brake circuit, for indicating the transmission of signals from the master controller to the control means when said first interlock switch is closed.

2. The connector of claim 1, wherein said connector includes a second interlock switch connected between said battery supply and said lock-out relay means and controlled by said lock-out relay means for opening and closing synchronously with said first interlock switch, said second interlock switch, when closed, connecting the battery supply to said lock-out relay means by a second current path separate from said first current path so that said lock-out relay means remains energized by the battery supply when said activating switch reopens the first current path.

3. The connector of claim 2, wherein said second interlock switch is mechanically linked to said first interlock switch.

4. The connector of claim 1, wherein said display means comprises individual display lamps for each respective power mode circuit and the brake circuit.

5. The connector of claim 1, wherein said display means further includes a ready lamp connected to said activating switch, said ready lamp being turned on when the battery supply is connected to said lock-out relay means by said activating switch.

6. The connector of claim 1, wherein said activating switch comprises a mechanical switch for closing the first current path.

7. The connector of claim 1, wherein said connector is small enough to be held in a user's hand.

8. The connector of claim 1, further comprising a polycarbonate housing, enclosing electrical components of said connector including said disabling means, said lock-out relay means, and said display means.

9. A portable sequence connector for connection to a control means of an electrically powered transit car, the control means having a plurality of power mode circuits for controlling acceleration and deceleration of the transit car by way of externally supplied electrical power in response to power request signals to the control means from a master controller, the transit car having a battery supply connected for selectively enabling the power mode circuits when the transit ca is not receiving externally supplied electrical power, comprising:

a plurality of power mode lamps having terminals for connection to a respective one of the power mode circuits, each power mode lamp indicating when a power request signal is applied to a respective one of the power mode circuits; and lockout relay means for preventing the transit car from accepting externally supplied power when said connector is connected to the control means and for selectively enabling the power mode circuits.

10. A connector according to claim 9, wherein said lockout relay means includes a relay and a normally open interlock switch coupled to said relay and creating an open circuit condition in the control means which prevents the transit car from accepting externally supplied electrical power when said connector is connected to the control means and said interlock switch is open; said connector further including a contact for making a connection with the battery supply when said connector is connected to the control means and an activating switch connected between said contact and said relay for selectively connecting said relay to the battery for closing said interlock switch when said connector is connected to the control means and the battery supply is energized and for opening said interlock switch when the battery supply is deenergized.

11. A connector according to claim 10, and further including indicating means for indicating the battery supply is energized and connected for enabling the power mode circuits; and means for connecting said indicating means to the battery supply when said activating switch connects said relay to the battery.

12. A connector according to claim 11, wherein said activating switch is biased in the open condition; and said connector further includes a second interlock switch ganged to said first interlock switch and connected between said contact and said indicating means so that when said activating switch is caused to connect said relay to the battery supply said relay closes both said first and second interlock switches, said second interlock switch thereby forming an independent connection between said indicating means and the battery supply even after said activating switch returns to its normally open condition.

13. A connector according to claim 12, wherein said indicating means comprises a lamp.

14. A connector according to claim 13, wherein said lamps each comprise a light emitting diode.

15. A connector according to claim 12, and further including a housing sized to be handheld, wherein said plurality of power mode lamps, indicating means and lockout relay means are mounted in said housing.

* * * * *